(12) United States Patent
Okano et al.

(10) Patent No.: US 10,005,283 B2
(45) Date of Patent: Jun. 26, 2018

(54) METHOD FOR MANUFACTURING LIQUID EJECTION HEAD

(71) Applicant: CANON KABUSHIKI KAISHA, Tokyo (JP)

(72) Inventors: Akihiko Okano, Fujisawa (JP); Takumi Suzuki, Yokohama (JP); Tamaki Sato, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 68 days.

(21) Appl. No.: 15/200,367

(22) Filed: Jul. 1, 2016

(65) Prior Publication Data
US 2017/0008290 A1 Jan. 12, 2017

(30) Foreign Application Priority Data

Jul. 10, 2015 (JP) ................. 2015-138730

(51) Int. Cl.
*B41J 2/14* (2006.01)
*B41J 2/16* (2006.01)
*G03F 7/20* (2006.01)

(52) U.S. Cl.
CPC .......... *B41J 2/1631* (2013.01); *B41J 2/162* (2013.01); *B41J 2/1603* (2013.01); *B41J 2/1628* (2013.01); *B41J 2/1639* (2013.01); *B41J 2/1645* (2013.01); *G03F 7/70* (2013.01)

(58) Field of Classification Search
None
See application file for complete search history.

(56) References Cited

U.S. PATENT DOCUMENTS

| 4,657,631 A | 4/1987 | Noguchi |
| 4,775,445 A | 10/1988 | Noguchi |
| 6,241,335 B1 | 6/2001 | Suzuki |
| 6,255,126 B1* | 7/2001 | Mathieu ............. G01R 1/06727 438/14 |
| 6,716,767 B2 | 4/2004 | Shih et al. |
| 8,191,260 B2 | 6/2012 | Kato et al. |
| 8,434,229 B2 | 5/2013 | Okano et al. |
| 8,613,141 B2 | 12/2013 | Okano et al. |
| 9,168,749 B2 | 10/2015 | Saito et al. |
| 2004/0012734 A1* | 1/2004 | Yamanaka ........... G02B 3/0031 349/95 |

(Continued)

FOREIGN PATENT DOCUMENTS

JP 6-45242 B2 6/1994

OTHER PUBLICATIONS

Ishikawa et al., U.S. Appl. No. 15/266,117, filed Sep. 15, 2016.

(Continued)

*Primary Examiner* — Erica Lin
(74) *Attorney, Agent, or Firm* — Fitzpatrick, Cella, Harper & Scinto

(57) ABSTRACT

There is provided a method for laminating a smooth thin resin layer on a substrate in manufacturing a liquid ejection head by a casting method. To achieve this, a resin layer having a sufficient thickness to fill a concave portion already existing on the substrate is applied and smoothed. Thereafter, a plurality of opening patterns (concave portions) are formed and then smoothed again to obtain a thin resin layer having a desired thickness.

20 Claims, 4 Drawing Sheets

(56) References Cited

U.S. PATENT DOCUMENTS

| | | | |
|---|---|---|---|
| 2012/0124835 A1* | 5/2012 | Okano | ............... B41J 2/1603 29/890.1 |
| 2017/0008289 A1 | 1/2017 | Okano et al. | |
| 2017/0087747 A1 | 3/2017 | Ishikawa et al. | |

OTHER PUBLICATIONS

Non-final Office Action in U.S. Appl. No. 15/200,377 (dated Jul. 12, 2017).

Okano et al., U.S. Appl. No. 15/200,377, filed Jul. 1, 2016.

* cited by examiner

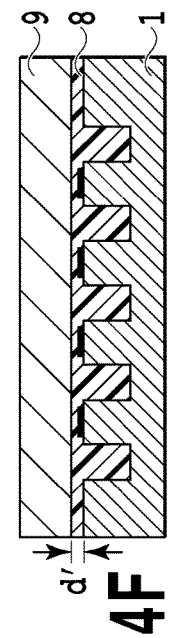
FIG.4A
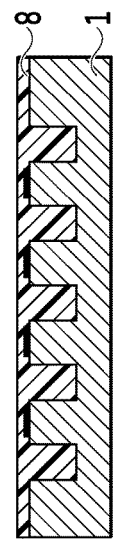
FIG.4B
FIG.4C
FIG.4D
FIG.4E
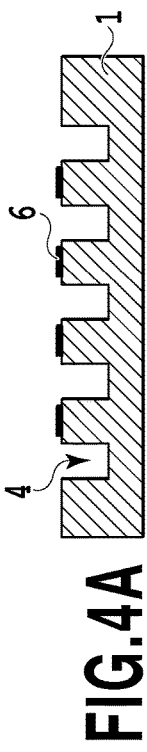
FIG.4F
FIG.4G
FIG.4H
FIG.4I
FIG.4J

METHOD FOR MANUFACTURING LIQUID EJECTION HEAD

BACKGROUND OF THE INVENTION

Field of the Invention

The present invention relates to a method for manufacturing a liquid ejection head.

Description of the Related Art

Like ink jet print heads, some liquid ejection heads which eject liquid as droplets from a plurality of elements are configured to have a substrate having elements for generating ejection energy arranged thereon, and a flow path forming member laminated on the substrate, the flow path forming member having formed thereon a flow path for guiding the liquid to each of the elements.

Japanese Patent Publication No. H06-45242 (1994) explains a process of manufacturing such a liquid ejection head by a casting method. More specifically, first, on a substrate having energy generating elements arranged thereon, a mold of an ink flow path is patterned by using a photosensitive material. Then, the formed mold pattern is coated with a resin and the resultant is set. Furthermore, after forming an ejection port which is in communication with the mold of the flow path on the coated member, the photosensitive material used for the mold pattern is removed. Accordingly, an area resulting from the removal of the photosensitive material forms a flow path for guiding liquid, and thus, a liquid ejection head having arranged therein the flow path for guiding liquid, an energy generating element, and an ejection port for ejecting the liquid is completed.

Meanwhile, U.S. Pat. No. 6,716,767 discloses a method for preventing concavo-convex portions from being generated also on a resin surface in accordance with a plurality of concavo-convex portions formed on a surface of a substrate when a casting method is used to coat the substrate with a photosensitive resin. More specifically, there is explained a process including providing various kinds of materials for adjusting steps on the substrate, applying the resin having a high viscosity to the surface of the substrate, and further, bringing a mold having a smooth surface into contact with an upper surface of a resin layer.

SUMMARY OF THE INVENTION

According to a first aspect of the present invention, there is provided a method for manufacturing a liquid ejection head including a substrate having formed thereon an energy generating element, wiring for supplying power to the energy generating element, and a supply port for supplying liquid, the substrate having laminated thereon a flow path forming member on which a flow path for guiding the liquid supplied from the supply port to the energy generating element is formed, the method comprising: a step for forming a resin layer by applying a resin to form an area to be the flow path on the substrate; a first smoothing step for smoothing a surface of the resin layer by pressing the resin layer with a smoothing member; a concave-portion-forming step for forming a concave portion on the resin layer by removing a portion of a resin from the resin layer smoothed by the first smoothing step; and a second smoothing step for smoothing a surface of the resin layer by pressing the resin layer on which the concave portion is formed by the concave-portion-forming step with the smoothing member.

According to a second aspect of the present invention, there is provided a method for smoothing a surface of a resin layer on a substrate, the method comprising: a step for forming a resin layer by applying a resin to form an area to be a flow path on the substrate; a first smoothing step for smoothing a surface of the resin layer by pressing the resin layer with a smoothing member; a concave-portion-forming step for forming a concave portion on the resin layer by removing a portion of a resin from the resin layer smoothed by the first smoothing step; and a second smoothing step for smoothing a surface of the resin layer by pressing the resin layer on which the concave portion is formed by the concave-portion-forming step with the smoothing member.

Further features of the present invention will become apparent from the following description of exemplary embodiments (with reference to the attached drawings).

BRIEF DESCRIPTION OF THE DRAWINGS

FIGS. 4A to 4J are views of a manufacturing process of a liquid ejection head according to a first embodiment.

DESCRIPTION OF THE EMBODIMENTS

By the way, along with the recent progress of minimizing a liquid droplet and making a finer liquid chamber for a liquid ejection head, a photosensitive resin layer is required to be laminated very thinly. However, flowability of a resin is low in a state where a layer is thin, and a flow resistance between a substrate and a mold is high. Accordingly, even if a mold having a smooth surface is brought into contact with an upper surface of a resin layer, it is difficult to sufficiently make a concavo-convex portion on the substrate uniform. If making pressing force to be applied to a mold larger or making a period of time for applying a pressure longer, the concavo-convex portion can be further suppressed, but in this case, a yield may decrease and a tact time may increase because of deformation of the mold or the substrate. In other words, it had been difficult to laminate a smooth and thin resin layer on the substrate by using a casting method.

The present invention has been made to solve the above problem. Accordingly, an object of the present invention is to provide a method for laminating a smooth and thin resin layer on a substrate by using a casting method.

First Embodiment

Figure 1:
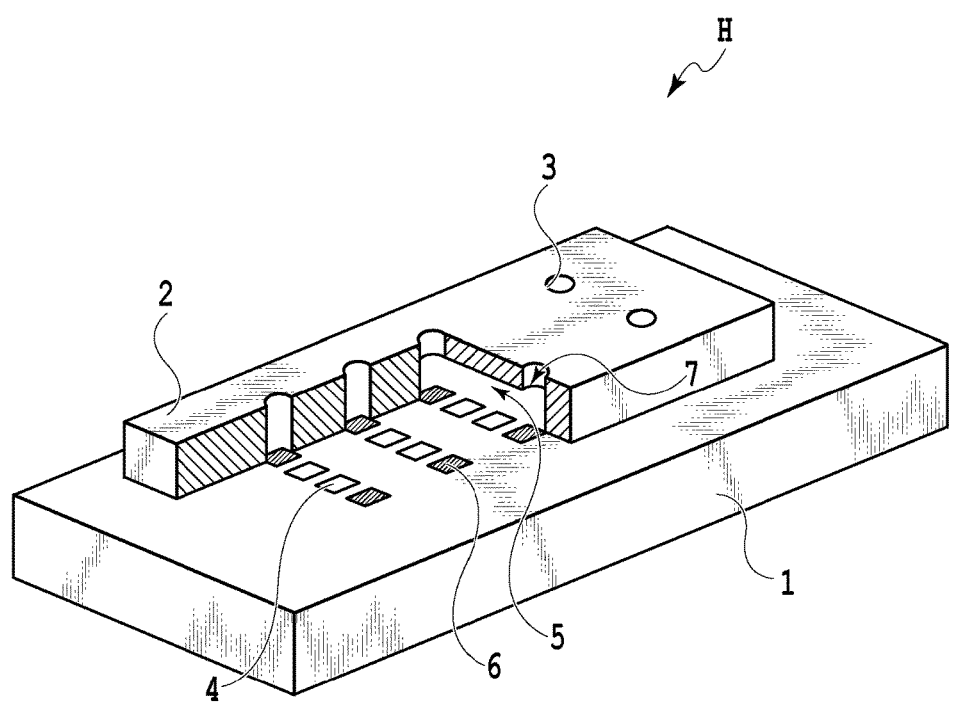
FIG. 1 is a schematic perspective view of an ink jet print head.

FIG. 1 is a schematic perspective view of an ink jet print head H (hereinafter referred to simply as a print head) which can be used as a liquid ejection head of the present invention. The print head H includes a substrate 1 on which a plurality of electrothermal transducers serving as energy generating elements 6, wiring (not shown) for supplying energy to the energy generating elements 6, and a supply port 4 formed adjacent to the wiring are formed, and a flow path forming member 2 laminated on the substrate 1. Ink supplied from a back surface of the substrate 1 via the supply port 4 flows into a flow path 5 formed on the flow path forming member 2 and is guided to a pressure chamber 7 corresponding to each of the energy generating elements 6 arranged with predetermined pitches. Then, if a predetermined voltage pulse is applied to the energy generating element 6, film boiling occurs in the ink in the pressure chamber 7, and the ink is ejected as a droplet from an ejection port 3 by a growing energy of generated bubbles.

Figure 2:
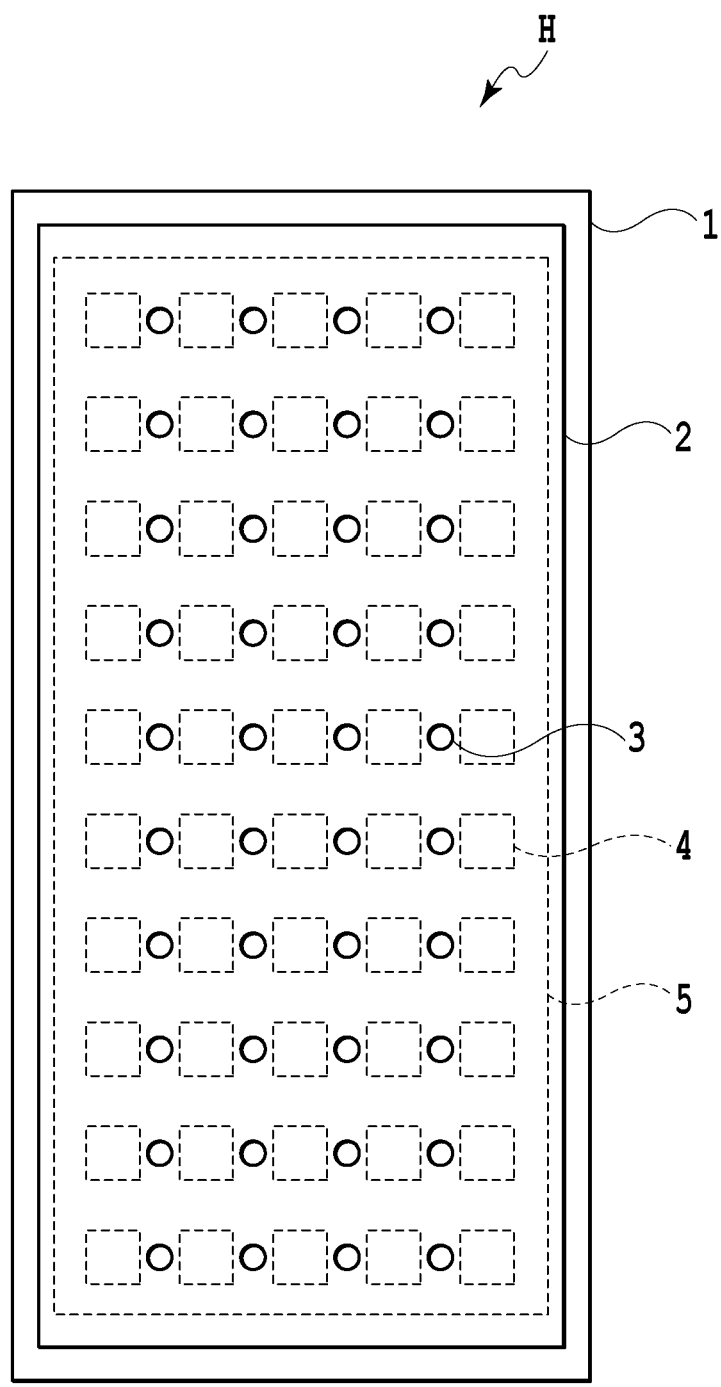
FIG. 2 is a view showing another example of the ink jet print head.

FIG. 2 is a view showing an example of the ink jet print head H having a structure different from the one shown in FIG. 1. In this example, the plurality of ejection ports 3 are arranged widely on a plane, and there are provided a number of supply ports 4 being relatively small in size arranged in positions corresponding to the ejection ports 3. In both of the structures shown in FIG. 1 and FIG. 2, a plurality of concavo-convex portions exist on the substrate 1.

Even before wiring or the like is formed, the substrate 1 generally used in the manufacture of semiconductors already has a concavo-convex portion of a few μm or greater if large. If wiring and an electrothermal transducer are further laid out on the substrate 1 as shown in FIG. 1 and FIG. 2, a concavo-convex portion of 10 μm or greater is eventually generated. Meanwhile, a hole shape having a size of a few tens to a few hundreds of μm is formed on a portion that subsequently serves as the supply port 4. Moreover, in the case of a thin resin layer, even if a resin is applied to the substrate having such concavo-convex portions and a smooth surface of a mold member is pressed on the surface of the substrate, there may be a case where sufficient flowability of a resin to fill the concave portion cannot be obtained and thus smooth surface cannot be achieved.

Figure 3A:
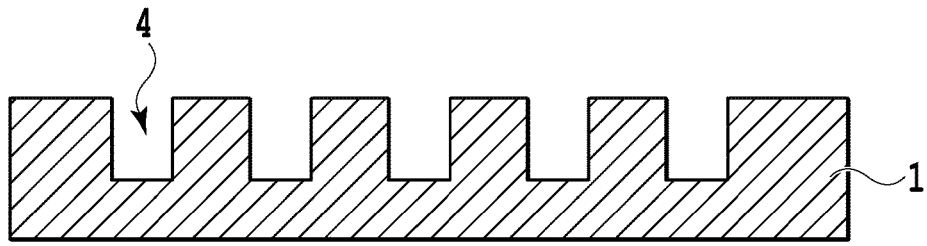
FIGS. 3A to 3D are views for explaining a mechanism of generating a concavo-convex portion on a surface of a flow path forming member.

FIGS. 3A to 3D are schematic views for explaining a mechanism of generating the concavo-convex portion on the surface of a resin layer in the case of forming a thin resin layer by using a conventional common casting method. FIG. 3A is a cross-sectional view of the substrate 1 before a photosensitive resin is applied. On the surface of the substrate 1, a plurality of concave portions that subsequently serve as supply ports 4 are formed.

Figure 3B:
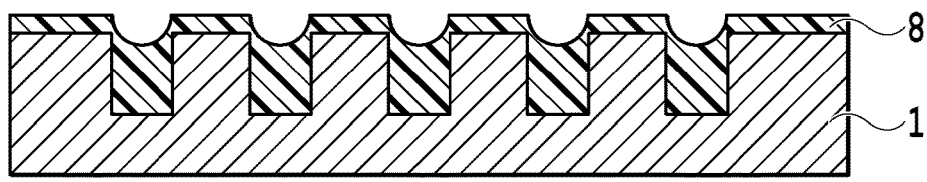

FIG. 3B shows a state in which a photosensitive resin layer 8 is given (applied in this example) on the surface of the substrate 1. Specifically, FIG. 3B shows a state of applying a photosensitive resin on the substrate in an amount to fill the plurality of concave portions that subsequently serve as the supply ports 4 and an additional amount to form a layer of about 5 μm on the resultant substrate. A liquid photosensitive resin layer 8 having a relatively high viscosity flows into the concave portion that subsequently serves as the supply port 4, and a concave portion is formed on the surface in accordance with the concave portion of the substrate 1. In such a concavo-convex portion on the resin surface, as the photosensitive resin has a higher viscosity, a self-leveling performance is lower, and thus the concavo-convex portion becomes distinguished. In general, the above phenomenon can be confirmed with a viscosity in the range of 100 to 10000 mPas. Also in a case where the photosensitive resin layer 8 has a low solid concentration, a concavo-convex portion tends to be easily formed because a difference in film-thinning occurs in accordance with a difference in a resin amount. In general, the phenomenon as shown in FIG. 3B can be confirmed for a solid concentration in the range of 10 to 30 wt %. Furthermore, as an aspect ratio of the concave portion increases, that is, as a depth with respect to a length of a bottom surface of the concave portion increases, the concavo-convex portion becomes distinguished.

Figure 3C:
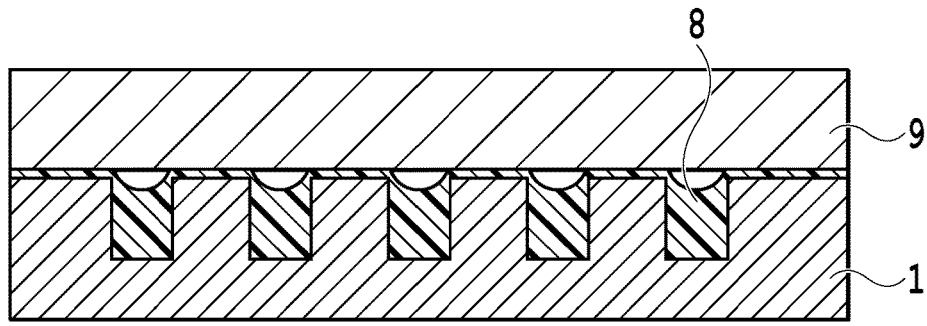

FIG. 3C shows a state in which a mold 9 having a smooth surface is pressed on an upper surface of the photosensitive resin layer 8 shown in FIG. 3B so as to apply a constant force to the entire area of the surface. If the resin on the convex portion is pressed with the mold 9 and the resin flows into the concave portion smoothly, the concave portion is filled and is caused to form a thin film of about 5 μm on the concave portion. However, since flowability of the photosensitive resin layer 8 whose thickness is not sufficiently ensured is low, a non-filled portion remains in the concave portion.

Figure 3D:
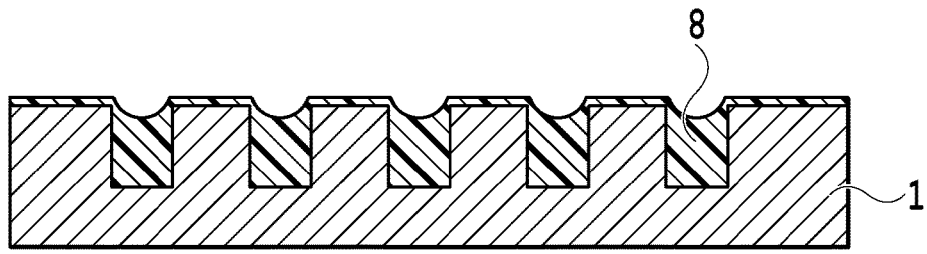

As a result, even after the mold 9 is separated, as shown in FIG. 3D, the concave portion remains in the resin layer 8. If the upper surface of the photosensitive resin layer 8 is coated with the resin to be the flow path forming member 2, the flow path obtained by removing the photosensitive resin layer 8 in a subsequent step includes the concavo-convex portion, causing variations in liquid chambers of the ejection elements and consequently the ejection states of the ejection elements.

At this time, if a relatively large amount of resin is applied at the stage of FIG. 3B, a sufficient flow rate can be obtained at the time of pressing with the mold 9, thereby filling the concave portion and achieving a smooth surface. In this case, however, the thickness of the resin layer is considerably larger than a set value (5 μm).

FIGS. 4A to 4J are views for explaining a manufacturing process of a liquid ejection head according to the present embodiment. FIG. 4A is a cross-sectional view of the substrate 1 before a resin for forming a flow path area is applied. On the substrate 1, the energy generating element 6, the wiring for supplying power to the energy generating element 6, and the supply port 4 for supplying liquid to the area of the energy generating element 6 are already formed.

FIG. 4B shows a state in which, on the substrate 1, a photosensitive resin layer 8 including a positive photosensitive resin for forming a flow path area in a subsequent step is formed. Specifically, in FIG. 4B, an amount of photosensitive resin larger than that of the photosensitive resin shown in FIG. 3B, that is, the photosensitive resin to form a layer of 20 μm or more is applied on the substrate 1. A liquid photosensitive resin layer 8 having a relatively high viscosity flows into the concave portion formed on the surface of the substrate 1, and a concavo-convex portion is formed on the surface in accordance with the concavo-convex portion of the substrate 1.

Subsequently, as shown in FIG. 4C, the mold 9 having the smooth surface is brought into contact with the entire area of the surface of the photosensitive resin layer 8, and is pressed with a uniform pressure until the concavo-convex portion disappears from the surface of the resin layer. As described above, since the sufficient amount of photosensitive resin is applied to the surface of the substrate 1, the photosensitive resin smoothly flows due to the pressing force, thereby filling the concave portion and smoothing the surface of the photosensitive resin layer 8. In this stage, a thickness d of the photosensitive resin layer 8 is more than 20 μm.

Next, as shown in FIG. 4D, a mask 10 having a plurality of openings 10a is disposed on the resin layer 8, and in this state, the resin layer 8 is exposed and developed. As a result, on the resin layer 8, opening patterns 11 are formed on a plurality of positions corresponding to the openings 10a as shown in FIG. 4E. In other words, new concave portions are formed on the photosensitive resin layer 8. At this time, in order to allow a flow amount in each area to be almost uniform at the time of subsequent pressing with the mold, it is preferable that the opening patterns 11 be formed in a uniform density (pitch) at the entire area. Note that the total volume of the concave portions of the opening patterns 11 formed in this stage is sufficiently smaller than the volume of the concave portions already formed on the substrate 1 and filled in FIG. 4D.

Thereafter, as shown in FIG. 4F, the mold 9 is again brought into contact with the entire area of the surface of the photosensitive resin layer 8, and is pressed with a uniform pressure until the opening patterns 11 disappear from the surface thereof. At this time, the thickness d of the photosensitive resin layer 8 before the pressing has a value sufficient to flow the photosensitive resin, and the concave portion of the opening pattern 11 is smoothly filled by the pressing with the mold 9. Consequently, the surface of the photosensitive resin layer 8 after separating the mold 9 becomes smooth as shown in FIG. 4G. Further, the thickness d' of photosensitive resin layer 8 in this stage is about 5 μm. More specifically, as a result of second smoothing with the mold 9 as shown in FIG. 4F, as the thickness of the photosensitive resin layer is reduced from d=20 μm to d'=5 μm, the number of and size of opening patterns 11 are formed on the resin layer 8 according to thus reduced volume. To be more specific, the openings 10a configured to form such opening patterns 11 are provided on the mask 10 beforehand.

Incidentally, it is preferable that pressing steps as shown in FIGS. 4C and 4F be performed in a vacuum environment to prevent extra air from entering between members or to avoid a position displacement caused by a vapor pressure in the resin layer 8. Furthermore, heating the photosensitive resin layer 8 to or higher than a glass transition point can increase flowability of the resin layer 8 and form the smooth surface in a shorter time. As for the mold 9, it is preferable to have a sufficient rigidity to avoid deformation or the like caused by a contact pressure. Furthermore, it is also effective to interpose an elastic body such as a rubber sheet, a sponge sheet, a graphite sheet, and the like around the mold 9 and the substrate 1 between which the resin layer 8 is sandwiched so as to balance load distribution in bringing the mold 9 into contact with the resin layer 8. In addition, to promptly separate the mold 9 after the contact from the resin layer 8, a mold release agent may be provided in advance on a contact surface of the mold 9.

Once the smooth surface as shown in FIG. 4G is obtained, then, the resin layer 8 of a flow path surface is exposed and developed by using a mask (not shown) on which a flow path pattern is formed. This can remove an area of the photosensitive resin layer 8 that is not masked, and a flow path mold pattern 12 as shown in FIG. 4H remains on the substrate 1.

Then, after a photocurable resin layer 13 is formed by coating with a new resin layer, the photocurable resin layer is exposed by using a mask (not shown) on which a pattern for ejection ports is formed, so that, as shown in FIG. 4I, the flow path forming member 2 having an ejection port 3 in a position facing the energy generating element 6 is completed. Furthermore, after forming a common supply port 14 from the back surface of the substrate 1, by removing the flow path mold pattern 12, an ink flow path is formed which extends from the common supply port 14 through the supply port 4 to the ejection port 3, and the liquid ejection head H of the present embodiment is completed.

According to the present embodiment described above, the resin layer having a sufficient thickness d to fill the concave portion which exists on the substrate is applied in advance to smooth the substrate. Thereafter, by forming the opening patterns to form the plurality of concave portions, a portion of the resin is removed from the resin layer, and by smoothing the resin layer again, a thin resin layer 8 having desired thickness d' (<d) can be obtained.

Incidentally, as described above, a description of a structure of obtaining the resin layer 8 having the desired thickness d' in the second smoothing step is given, but the desired thickness d' may be approached by repeating the thinning steps shown in FIGS. 4D to 4G multiple times in a stepwise manner. At this time, an initial amount of the resin to be applied in FIG. 4B, a repeating number of the thinning step and the sizes and numbers of the opening patterns to be formed in FIG. 4D may be appropriately adjusted according to physical properties of photosensitive resin to be used, set values of the thickness, and the state of the concavo-convex portion formed on the substrate beforehand. Further, the number of and size of the openings 10a, that is, a mask 10 to be used may be different depending on an exposure step shown in FIG. 4D. At this time, since flow resistance against allowing the resin flow increases as the layer becomes thinner, it is preferable that the size of and interval between the openings 10a be reduced every time the thinning step is repeated.

It is preferable that the size of and interval between the opening patterns be also adjusted according to physical properties such as a viscosity or a glass transition point of a photosensitive resin and conditions (a temperature, a pressure, a time period, and the like) when bringing the mold 9 into contact with the resin layer 8. In general, a flow rate of the resin with a high viscosity tends to be small, and the flowing and smoothing the resin is performed more smoothly in a case of providing a number of openings having smaller areas rather than providing a fewer openings having larger areas. Furthermore, a flow rate tends to be small also in a case where the conditions of bringing the mold 9 into contact with the resin layer 8 are a low temperature, a low pressure, and a short time period. Accordingly, in this case as well, it is preferable to set the small opening pattern to a high density. As an example, using a resin material having a glass transition point in the vicinity of 100° C., a viscosity of 500 to 1000 cP before coating, and a solid concentration of 10 to 20%, a case of obtaining the resin layer having a thickness of about 10 μm is assumed. In this case, it is effective to form the pitch of 100 to 200 μm for the opening pattern 11 having a diameter of 50 to 100 μm.

Nevertheless, a thin resin layer sufficiently smoothed can securely be formed by forming a resin layer having a sufficient thickness in a first coating and smoothing step, and then by performing at least one additional concave-portion-forming step and at least one additional smoothing step.

Verification Example

With reference to FIGS. 4A to 4J, a verification example of a manufacturing process of an ink jet print head will be specifically described.

First, as a substrate 1, a silicon substrate 1 having a plurality of heaters for ejecting ink, a driver for driving the heaters, and a logic circuit formed thereon was prepared (FIG. 4A). Then, a resin layer 8 made of a photodegradable positive resist was formed on the substrate 1 (FIG. 4B). As the photodegradable positive resist, polymethyl isopropenyl ketone (ODUR-1010 available from Tokyo Ohka Kogyo Co., Ltd.) having a resin concentration of 20 wt % was prepared. Then, polymethyl isopropenyl ketone was applied to the substrate 1 by spin coating and prebaked on a hot plate at a temperature of 120° C. for three minutes, then in a nitrogen-substituted oven at a temperature of 150° C. for 30 minutes.

Then, in a vacuum chamber, a mold 9 having a contact surface polished to be flat was disposed on the resin layer 8, and by using press machine (ST-200) available from TOSHIBA MACHINE CO., LTD, the substrate 1 and the resin layer 8 were heated and pressurized from top and bottom (FIG. 4C). Then, after confirming that the concavo-convex portion of the resin layer 8 is filled, the mold 9 was separated from the resin layer 8. As a result, a positive resist layer having a thickness of d=20 μm was obtained.

Next, by using Deep-UV exposure machine UX-3000 (trade name) available from USHIO INC., the resin layer 8 was irradiated with Deep-UV light at an exposure rate of 18000 mJ/cm$^2$ with a mask 10 on which an opening pattern is rendered (FIG. 4D). Then, the resin layer 8 was developed by using a methyl isobutyl ketone (MIBK) (nonpolar solvent)/xylene=2/3 solution, and subjected to rinse processing by using xylene, whereby an opening pattern 11 was formed on the substrate 1 (FIG. 4E).

Next, in a vacuum chamber, by using press machine (ST-200) available from TOSHIBA MACHINE CO., LTD again, the substrate 1 and the resin layer 8 were heated and pressurized from top and bottom (FIG. 4F). Then, after confirming that the opening pattern 11 formed on the resin layer 8 was filled, the mold 9 was separated from the resin layer 8 (FIG. 4G). As a result, a positive resist layer having a thickness of d=5 μm was obtained.

Then, by using Deep-UV exposure machine UX-3000 (trade name) available from USHIO INC., the resin layer 8 was irradiated with Deep-UV light at an exposure rate of 18000 mJ/cm$^2$ with a mask on which a flow path mold pattern was rendered. Then, the resin layer 8 was developed by using a methyl isobutyl ketone (MIBK) (nonpolar solvent)/xylene=2/3 solution, and subjected to rinse processing by using xylene, whereby a flow path mold pattern 12 was formed on the substrate 1 (FIG. 4H).

Next, on the flow path mold pattern 12, a photocurable resin layer 13 was formed by coating with a photocurable resin. At this time, as the photocurable resin, a resist solution of a composition as follows was used.

EHPE-3150 (trade name, available from Daicel Corporation) 100 parts by weight
HFAB (trade name, available from Central Glass Co., Ltd.) 20 parts by weight
A-187 (trade name, available from NUC Corporation) 5 parts by weight
SP170 (trade name, available from ADECA CORPORATION) 2 parts by weight
Xylene 80 parts by weight Then, the above resist solution was applied to the flow path mold pattern 12 by spin coating and prebaked on a hot plate at a temperature of 90° C. for three minutes. As a result, the photocurable resin layer 13 having a thickness of 10 μm (on a flat plate) was formed.

Furthermore, by using mask aligner MPA600FA (available from Canon Inc.), after being pattern-exposed at an exposure rate of 3000 mJ/cm$^2$ by using a mask on which an ejection port pattern was rendered, the photocurable resin layer 13 was subjected to post exposure bake (PEB) at a temperature of 90° C. for 180 seconds and allowed to cure. Then, the photocurable resin layer 13 was developed by using a methyl isobutyl ketone/xylene=2/3 solution, and subjected to rinse processing by using xylene, whereby a plurality of ejection ports 3 were formed on the photocurable resin layer 13 (FIG. 4I).

Next, a protection layer was applied to the surface of the substrate 1 to form an etching mask of a slit type by a positive resist on a back surface of the substrate 1, and by performing dry etching with Pegasus available from SUMITOMO PRECISION PRODUCTS Co., Ltd., a common supply port 14 was formed. Furthermore, after removing the protection layer, by using Deep-UV exposure machine UX-3000 (trade name) available from USHIO INC., the entire surface of the common supply port 14 was exposed at an exposure rate of 7000 mJ/cm$^2$, and the resin forming the flow path mold pattern 12 was dissolved. Then, by immersing it in methyl lactate while giving ultrasound waves, the flow path mold pattern 12 was removed, whereby the ink jet print head was completed (FIG. 4J).

In the ink jet print head manufactured by the above method, it was possible to extend uniformly a liquid path having a height of 5 μm. Accordingly, in a case where the ink jet print head was mounted on a predetermined printing apparatus and a printing operation was performed, it was possible to eject small liquid droplets in a uniform ejection amount from the plurality of ejection ports in a uniform and stable manner, and a high-quality output image was confirmed.

Second Embodiment

Also in the present embodiment, like the first embodiment, an ink jet print head is manufactured according to FIGS. 4A to 4I. In the present embodiment, however, an opening pattern 11 is formed by a dry etching method.

First, as a substrate 1, a silicon substrate 1 having a plurality of heaters for ejecting ink, a driver for driving the heaters, and a logic circuit formed thereon is prepared (FIG. 4A). A resin layer 8 made of a photodegradable positive resist is formed on the substrate 1 (FIG. 4B).

Then, in a vacuum chamber, a mold 9 having a contact surface polished to be flat was disposed on the resin layer 8, and by using press machine (ST-200) available from TOSHIBA MACHINE CO., LTD, the substrate 1 and the resin layer 8 were heated and pressurized from top and bottom (FIG. 4C). Further, after confirming that the concavo-convex portion of the resin layer 8 is filled, the mold 9 was separated from the resin layer 8. As a result, a positive resist layer having a thickness of d=20 μm was obtained.

Next, an etching-resistant resist layer (THMR-IP5700, available from TOKYO OHKA KOGYO CO., LTD.) serving as an etching mask is formed on the resin layer 8. Then, by the exposure by using a photomask on which an opening pattern is rendered, the etching-resistant resist layer is removed except a mask area, and a pattern of the etching-resistant resist layer is formed on the positive resist layer. Then, by performing dry etching processing, the positive resist other than an area in which a pattern is formed by the etching-resistant resist layer is removed, and further, by removing the remaining etching-resistant resist layer, the opening pattern 11 is formed on the positive resist layer. The subsequent steps, that is, the steps of FIGS. 4F to 4J, are performed in the same manner as in the first embodiment.

Furthermore, in the present embodiment, the thinning step for the resin layer may be divided into multiple steps to gradually adjust a thickness to a target thickness as in the first embodiment.

In the ink jet print head manufactured by the above method, it was possible to extend uniformly a liquid path having a height of 5 μm in any ejection port area. In a case where the ink jet print head is mounted on a predetermined printing apparatus and a printing operation is performed, small liquid droplets can be uniformly and stably ejected from each ejection port, and a high-quality output image is confirmed.

According to the above embodiment, a thin resin layer sufficiently smoothed is securely formed by forming a resin layer having a sufficient thickness in a first coating and smoothing step, and then by repeating at least one additional concave portion-forming step and at least one additional smoothing step.

It should be noted that in the above, as the resin for forming the flow path mold pattern 12, a positive photosensitive resin is used in terms of easiness of removal, a negative resin may also be used. Furthermore, the resin may be heated for liquidization by using a thermosensitive resin instead of the photosensitive resin.

Descriptions have been given of an example of forming the opening pattern 11 on the resin layer 8 by the exposure step by using the mask 10 in the first embodiment and of an example of forming the opening pattern 11 on the resin layer 8 by dry etching in the second embodiment, but the formation of the opening pattern of the present invention is not limited to these methods. For example, the concave portion may be formed by irradiating a laser beam. Whichever method is adopted, the present invention encompasses a case where the concave portion according to the level of thinning is formed on the resin layer 8 before performing the second or further smoothing steps.

Furthermore, in the above embodiment, the mold 9 having a smooth surface is brought into contact with the resin layer 8 as a smoothing member, but the present invention is not limited to this. For example, rotation and movement of a roller held at a constant height while being in contact with the surface of the resin layer 8 can also smooth the surface of the resin layer 8. Furthermore, it is also possible to use a method for facilitating flowability of a resin by heating and a method for adjusting a solvent content of a resin for leveling the surface of the resin layer 8.

Furthermore, in the above embodiments, descriptions have been given of the examples of the ink jet print heads mounted on the printing apparatus, but the liquid ejection head of the present invention is applicable to various fields. Other than the printing apparatus, the ink jet print head may be mounted on a copier and a facsimile, and further on an industrial printing apparatus combined with various processing apparatuses. As a matter of course, liquid to be ejected is not limited to ink for printing an image, and for example, the liquid ejecting head can be used for various applications such as for creating a biochip, printing an electronic circuit, and ejecting a drug in a spray form.

Further, the present invention is not limited to the method for manufacturing the liquid ejection head, and can be applied to a case where the surface of the resin layer formed on the substrate is desired to be smoothed. Examples of the process of manufacturing a semiconductor may include a process of smoothing the surface of the resin layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-138730 filed Jul. 10, 2015, which is hereby incorporated by reference wherein in its entirety.

What is claimed is:

1. A method for manufacturing a liquid ejection head including a substrate having formed thereon an energy generating element, wiring for supplying power to the energy generating element, and a supply port for supplying a liquid, the substrate having laminated thereon a flow path forming member on which a flow path for guiding the liquid supplied from the supply port to the energy generating element is formed, the method comprising:

a step for forming a resin layer by applying a resin to form an area to be the flow path on the substrate;

a first smoothing step for smoothing a surface of the resin layer so that the resin layer has a first thickness, by pressing the resin layer with a smoothing member;

a concave-portion-forming step for forming a concave portion on the resin layer by removing a portion of the resin layer smoothed by the first smoothing step; and a second smoothing step for smoothing a surface of the resin layer so that the resin layer has a second thickness, which is less than the first thickness, by pressing the resin layer on which the concave portion is formed by the concave-portion-forming step with the smoothing member.

2. The method for manufacturing the liquid ejection head according to claim 1, wherein in the concave-portion-forming step, a plurality of the concave portions are formed on the resin layer in a uniform density.

3. The method for manufacturing the liquid ejection head according to claim 1, wherein after the second smoothing step, the concave-portion-forming step and the second smoothing step are further repeated to reduce a thickness of the resin layer in a stepwise manner.

4. The method for manufacturing the liquid ejection head according to claim 3, wherein every time the concave-portion-forming step is repeated, a size of the concave portion to be formed and an interval between the concave portions are reduced in a stepwise manner.

5. The method for manufacturing the liquid ejection head according to claim 1, wherein the resin is a photosensitive resin, and wherein in the concave-portion-forming step, the concave portion is formed on the resin layer by exposing and developing the resin layer by using a mask having a hole in a position in which the concave portion is to be formed.

6. The method for manufacturing the liquid ejection head according to claim 1, wherein in the concave-portion-forming step, the concave portion is formed on the resin layer by a dry etching method.

7. The method for manufacturing the liquid ejection head according to claim 1, wherein the smoothing member is a mold member having a smooth surface to be in contact with the resin layer.

8. The method for manufacturing the liquid ejection head according to claim 1, wherein in the first and second smoothing steps, the smoothing member is heated while being pressed on the resin layer.

9. The method for manufacturing the liquid ejection head according to claim 1, further comprising, as steps performed after the second smoothing step, the steps of:

forming a flow path mold pattern on the substrate by leaving the resin layer corresponding to an area to be the flow path;

forming an ejection port for ejecting a liquid droplet after applying a resin to be the flow path forming member on the flow path mold pattern and curing the resin; and removing the flow path mold pattern.

10. A method for smoothing a surface of a resin layer on a substrate, the method comprising:

a step for forming a resin layer by applying a resin to form an area to be a flow path on the substrate;

a first smoothing step for smoothing a surface of the resin layer so that the resin layer has a first thickness, by pressing the resin layer with a smoothing member;

a concave-portion-forming step for forming a concave portion on the resin layer by removing a portion of the resin layer smoothed by the first smoothing step; and a second smoothing step for smoothing a surface of the resin layer so that the resin layer has a second thickness, which is less than the first thickness, by pressing the resin layer on which the concave portion is formed by the concave-portion-forming step with the smoothing member.

11. The method according to claim 10, wherein in the concave-portion-forming step, a plurality of the concave portions are formed on the resin layer in a uniform density.

12. The method according to claim 10, wherein after the second smoothing step, the concave-portion-forming step and the second smoothing step are further repeated to reduce a thickness of the resin layer in a stepwise manner.

13. The method according to claim 12, wherein every time the concave-portion-forming step is repeated, a size of the concave portion to be formed and an interval between the concave portions are reduced in a stepwise manner.

14. The method according to claim 10, wherein the resin is a photosensitive resin, and wherein in the concave-portion-forming step, the concave portion is formed on the resin layer by exposing and developing the resin layer by using a mask having a hole in a position in which the concave portion is to be formed.

15. The method according to claim 10, wherein in the concave-portion-forming step, the concave portion is formed on the resin layer by using a dry etching method.

16. The method according to claim 10, wherein the smoothing member is a mold member having a smooth surface to be in contact with the resin layer.

17. The method according to claim 10, wherein in the first and second smoothing steps, the smoothing member is heated while being pressed on the resin layer.

18. The method according to claim 10, further comprising, as steps performed after the second smoothing step, the steps of:

forming a flow path mold pattern on the substrate by leaving the resin layer corresponding to an area to be the flow path;

forming an ejection port for ejecting a liquid droplet after applying a resin to be a flow path forming member on the flow path mold pattern and curing the resin; and removing the flow path mold pattern.

19. The method for manufacturing the liquid ejection head according to claim 1, wherein in the concave-portion-forming step, a number of concave portions are formed, and wherein the number of the concave portions and a size of the concave portions correspond to a difference between the first thickness and the second thickness.

20. The method according to claim 10, wherein in the concave-portion-forming step, a number of concave portions are formed, and wherein the number of the concave portions and a size of the concave portions correspond to a difference between the first thickness and the second thickness.

* * * * *